(12) United States Patent
Coughlin, Jr.

(10) Patent No.: US 6,181,193 B1
(45) Date of Patent: Jan. 30, 2001

(54) USING THICK-OXIDE CMOS DEVICES TO INTERFACE HIGH VOLTAGE INTEGRATED CIRCUITS

(75) Inventor: Terry C. Coughlin, Jr., Endicott, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/415,862

(22) Filed: Oct. 8, 1999

(51) Int. Cl.$^7$ .................................................. H03K 3/01
(52) U.S. Cl. .................... 327/534; 327/325; 327/108; 327/110; 361/56; 361/91
(58) Field of Search ........................... 327/108–112, 530, 327/534, 325, 391, 328; 361/56, 91

(56) References Cited

U.S. PATENT DOCUMENTS

| | | | |
|---|---|---|---|
| 5,301,081 | 4/1994 | Podell et al. ........................... | 361/56 |
| 5,338,978 | 8/1994 | Larsen et al. ......................... | 327/534 |
| 5,396,128 | * 3/1995 | Dunning et al. ...................... | 327/534 |
| 5,576,635 | * 11/1996 | Partovi et al. ........................ | 327/534 |
| 5,719,525 | 2/1998 | Khoury ................................. | 327/562 |
| 5,852,540 | * 12/1998 | Haider ................................... | 361/56 |

* cited by examiner

Primary Examiner—Terry D. Cunningham
Assistant Examiner—Long Nguyen
(74) Attorney, Agent, or Firm—Scully, Scott, Murphy & Presser; John R. Pivnichny

(57) ABSTRACT

A high voltage tolerant CMOS input/output interface circuit. In this circuit, a process feature called "dual-gate" or "thick-oxide" process is used on any devices that will be exposed to high voltage. The thick-oxide devices have a larger capacitance and lower bandwidth, and therefore, preferably, they are only used where exposure to high voltage can cause damage. The remaining devices on the interface circuit may all use a standard process with the thinner oxide, allowing the I/O and the core IC to run at maximum speed. The circuit design topology also limits the number of devices that are exposed to high voltage. Preferably, the protection scheme is broken down into two parts: the driver and receiver.

2 Claims, 4 Drawing Sheets

USING THICK-OXIDE CMOS DEVICES TO INTERFACE HIGH VOLTAGE INTEGRATED CIRCUITS

BACKGROUND OF THE INVENTION

1. Technical Field

This invention generally relates to CMOS Integrated Circuit Technology. More specifically, the invention relates to high voltage tolerant CMOS input/output buffer interface circuits.

2. Prior Art

The industry road map for CMOS integrated circuit (IC) technology is to move to lower power supply voltages. There are many reasons for this trend, but the main reasons are the demand for higher integration density and lower power consumption. With the emergence of high performance electronics required for battery operated devices, such as lap-top computers, pagers, cellular phones, etc., it is critical to reduce the size and power consumption of these ICs. Because the industry is also performance driven, ultra fast CMOS devices have very thin gate oxides that determine the maximum voltage these devices can withstand without causing permanent damage to the device.

Each new technology release may yield higher chip density with faster clock speeds and lower power consumption. This may substantially improve performance and significantly reduce the product cost. This creates a problem, however, when signals are driven on and off the chip through older or "standard" interfaces. New interface standards are being developed to take advantage of the newer technologies, however many older (higher voltage) interfaces remain in use. One of the challenges in I/O design today is to design I/O buffers that meet the older specifications for high voltage swings. If a standard 5 volt signal were applied directly to a CMOS I/O processed in a state-of-the-art technology (i.e., 1.5V CMOS technology), the stress caused by the 5 volt signal would cause permanent damage to the silicon IC.

SUMMARY OF THE INVENTION

An object of this invention is to provide an improved high voltage tolerant input/output buffer circuit.

Another object of the present invention is to use an integrated circuit process feature and circuit design techniques to meet the high voltage interface specifications without causing damage to the silicon.

These and other objectives are achieved with a high voltage tolerant CMOS input/output interface circuit. In this circuit, a process feature called "dual-gate" or "thick-oxide" process is used on any devices that will be exposed to high voltage. The thick-oxide devices have a larger capacitance and lower bandwidth, and therefore, preferably, they are only used where exposure to high voltage can cause damage. The remaining devices on the interface circuit may all use the standard process with the thinner oxide, allowing the I/O and the core IC to run at maximum speed. The circuit design topology also limits the number of devices that are exposed to high voltage. Preferably, the protection scheme is broken down into two parts: the driver and receiver.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

In the following description of the preferred embodiments of the present invention, three voltage values are discussed:

1. "Technology Voltage" (TV)—This is the DC voltage the CMOS technology was designed for to achieve maximum performance. This is the IC's VDD.
2. "Maximum Technology Voltage" (MTV)—This is the maximum DC voltage the technology can operate at across the drain-to-source, or gate-to-source without causing damage to the devices over the life of the IC.
3. Maximum Interface Voltage" (MIV)—The is the maximum DC voltage the I/O must receive from off-chip.

Figure 1:
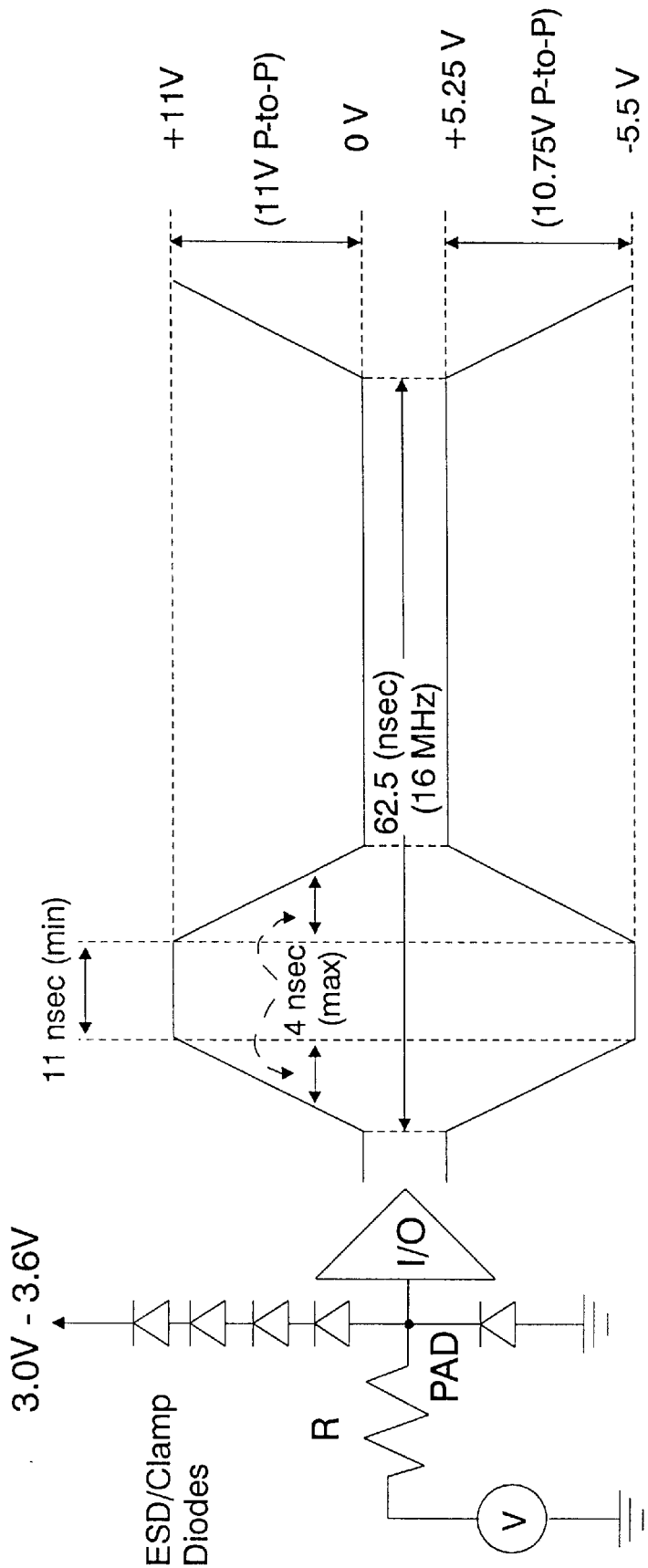
FIG. 1 shows a typical test condition for a PCI I/O in a 5 Volt environment.

FIG. 1 shows a typical test condition for a PCI I/O in a 5 volt environment. The PAD is subjected to +11 Volts peak-to-peak, and +5.25 Volts DC (MIV). This type of stress may cause damage to thin-oxide devices ranging from minor degradation to failure, depending on the CMOS technology used.

The present invention uses an integrated circuit process feature and circuit design techniques to meet the high voltage interface specifications without causing damage to the silicon. For purposes of illustration, the disclosed embodiment of the invention uses a +5 Volt (MIV) PCI interface designed in a 2.5 Volt (TV) CMOS technology with a 3.3 Volt (MTV). The invention can also be applied to a 1.8 Volt, 1.5 Volt or lower voltage technology (TV) because as TV and MTV decrease, the MIV stays constant for any I/O interface.

More specifically, the present invention uses a process feature called "dual-gate" or "thick-oxide" process on any devices that will be exposed to high voltage (MIV). The thick-oxide devices have a larger capacitance and lower bandwidth, and therefore, preferably, they are only used where exposure to high voltage can cause damage. The remaining devices all use the standard process with the thinner oxide, allowing the I/O and the core IC to run at maximum speed. The circuit design topology also limits the number of devices that are exposed to high voltage. The combination of the use of thick oxide devices and overall circuit design is the solution to the problem.

Figure 2:
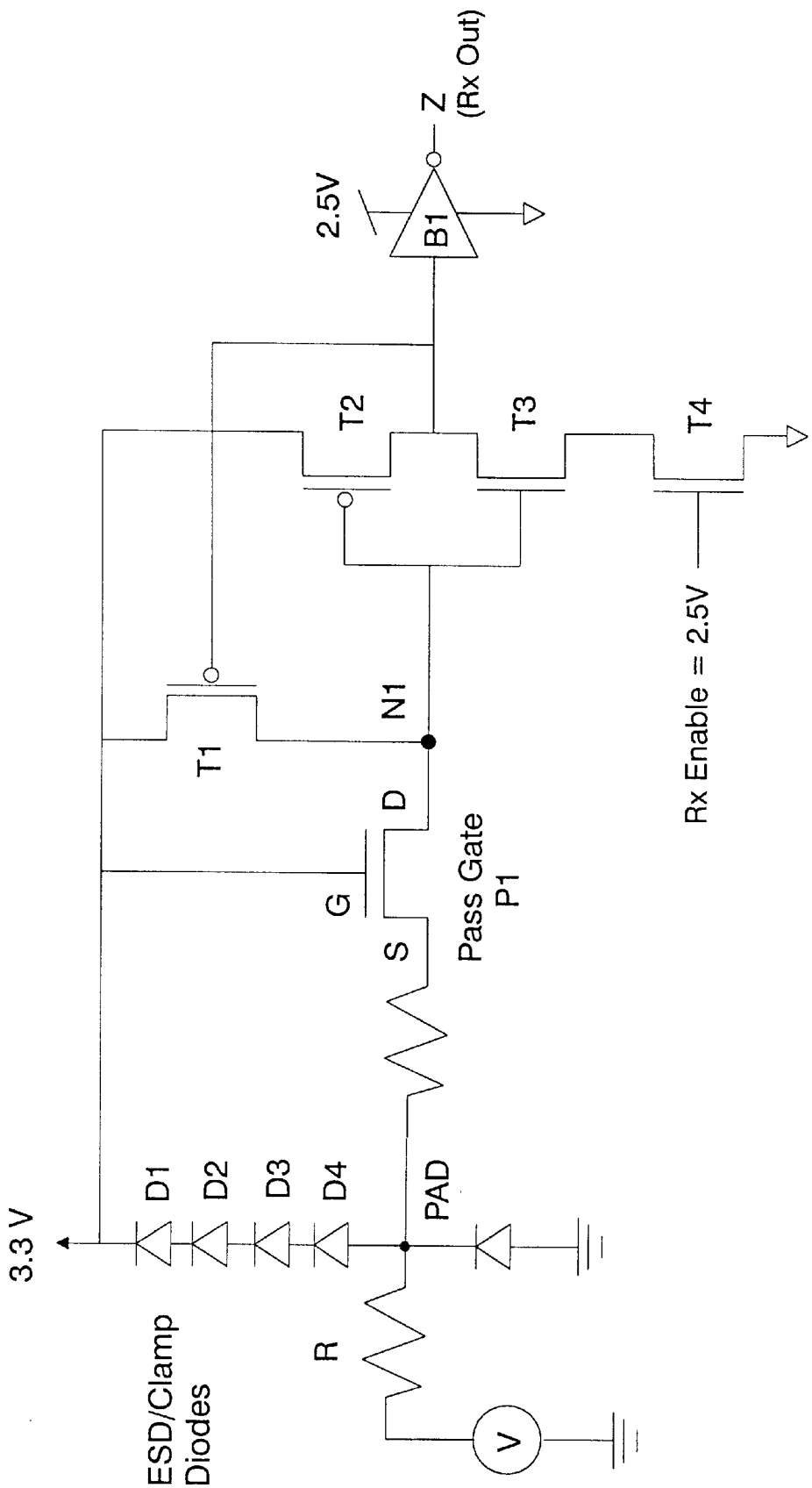
FIG. 2 illustrates a receiver protection topology embodying the present invention.

The protection scheme is separated into two parts: the driver and receiver. One embodiment of a receiver protection topology is shown in FIG. 2. To protect against high PAD voltages (MIV), a thick-oxide pass gate (P1) is utilized to protect all remaining thin-oxide devices. The gate of P1 is tied to the highest voltage (MTV) allowed for the technology, which in this example is 3.3 Volts. This limits the voltage at node N1 to a voltage-threshold drop below 3.3 Volts. The remainder of the receiver design is standard, and transistors T1–T4 set the receiver threshold. Transistor T1 also act as a keeper device, allowing transistor T2 to be fully turned off when a weak voltage is transmitted through the pass gate P1. Buffer B1 is used to level-shift down the voltage to the IC's core voltage (TV) and to drive the receiver output across the IC. The receiver is protected from both negative and positive voltages at the PAD.

For positive voltages applied to PAD, a string of 4 ESD diodes (D1–D4) limits the voltage at PAD to four diode drops above the 3.3V supply. Hence, for Vt=Vd=1 volt, where Vd is the diode forward bias voltage and Vt is the threshold voltage of the NFET P11, the voltage at PAD is a maximum of 7.3 Volts (3.3V+1V+1V+1V+1V). The Vsg (gate voltage) of P1 is 4 Volts (Vd1+Vd2+Vd3 +Vd4), which is greater than the MTV of 3.3 Volts of a standard device. Under this same condition, the thick-oxide device P1 also limits the voltage at node N1 to 2.3 Volts (3.3V−Vt). This single device P1 protects all remaining devices to voltages less than the MTV.

For negative voltages at PAD, ESD diode D5 clamps the PAD voltage to −1 Volt (ground-Vd). Under this condition, the gate-to-source voltage Vgs of P1 is limited to 4.3 Volts, which is greater than the MTV of a standard device. The −1 Volt at PAD is passed to node N1, where thick-oxide devices T1–T4 protect buffer B1 from voltages greater than the MTV.

Figure 3:
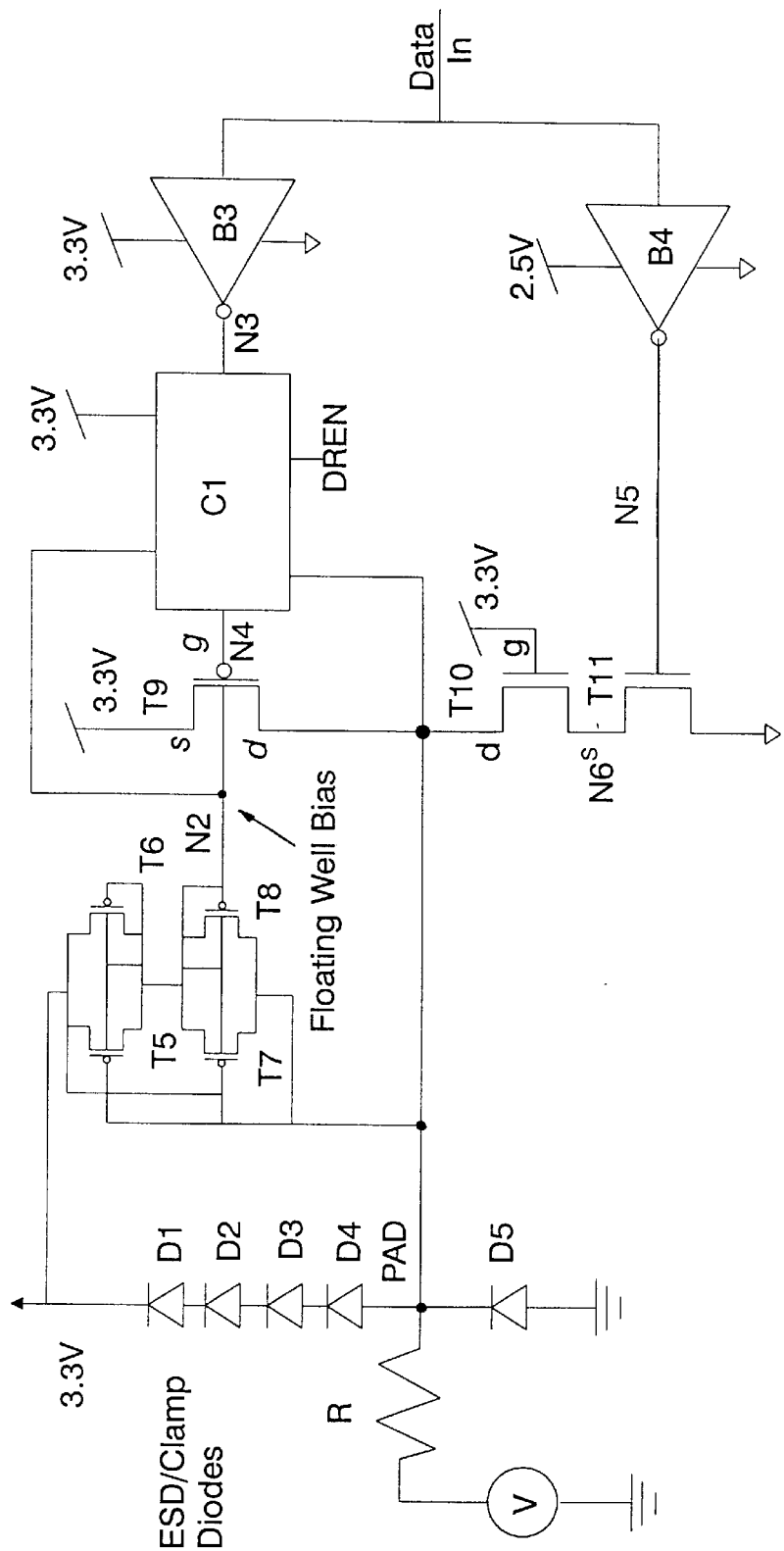
FIG. 3 shows a drive protection topology also embodying this invention.

One embodiment of a driver protection topology of the I/O is shown in FIG. 3. Transistors T5–T11 are thick-oxide devices that can withstand the high pad voltages (MIV). Transistors T5–T8 form an N-WELL bias circuit that will hold node N2 at 3.3 Volts for PAD voltages less than or equal to 3.3 Volts, and allow node N2 to track the PAD voltage when the PAD voltage rises above the output 3.3 Volts supply. This biases the N-WELL of the output PFET (T9) to track whichever voltage is higher, PAD or 3.3 Volts.

Transistors T10 and T11 are a pair of stacked thick-oxide NFETs that allow higher ESD breakdown voltages and reduced hot-electron degradation in the driver's output characteristics. Buffers B3 and B4 are predrive circuits that control the driver slew rate and di/dt. The predrive circuits are protected from the high voltage inputs by the thick-oxide devices T9–T11 and circuit C1. The NFET predrive buffer B4 is powered from the core IC voltage (TV). The PFET predrive circuit is powered by the output 3.3 Volts supply (MTV), and this is required to fully turn off the output PFET T9.

When the I/O is in a receive mode, the driver is disabled or put into a high impedance mode (Hi-Z). In this mode, the node N4 is held high (3.3 Volts) by B3 and C1, turning off transistor T9. Node N5 is held low (0.0 Volts) by B4, turning off transistor T11. When receiving high voltage interface signals (MIV), the disabled driver is also exposed to the high voltage. The driver voltage protection is described below.

For negative voltages applied to PAD, ESD diode D5 clamps the PAD voltage to −1 Volt, as described in the receiver protection scheme. This clamp limits the voltage across the gate or drain-to-source voltage of transistors T5–T11 to 4.3 Volts or less. 4.3 Volts is more than the MTV, but less than any thick oxide device limitation.

For positive voltages applied to PAD, the PAD voltage is clamped at 7.3 Volts by the same ESD diodes D1–D4, as described in the receiver protection scheme. Thick-oxide devices T5–T11 and C1 protect the IC from voltages greater than the TV, and the pull down section of the driver is protected by transistors T10 and T11. Under this condition, transistor T10 acts as a pass gate limiting the voltage at node N6 to a threshold drop below 3.3 Volts. The 7.3 Volts at PAD is only 2.3 Volts at node N6. Thick oxide device T10 can handle the Vdg of 4 Volts (7.3V−3.3V) and the Vds of 5 Volts (7.3V−2.3V), both of which are greater than the MTV. PFET T9, being thick oxide, can tolerate the 7.3 Volts at PAD, and the floating N-WELL circuit prevents the parasitic diode T9 from clamping the pad voltage to less than 7.3 Volts.

Figure 4:
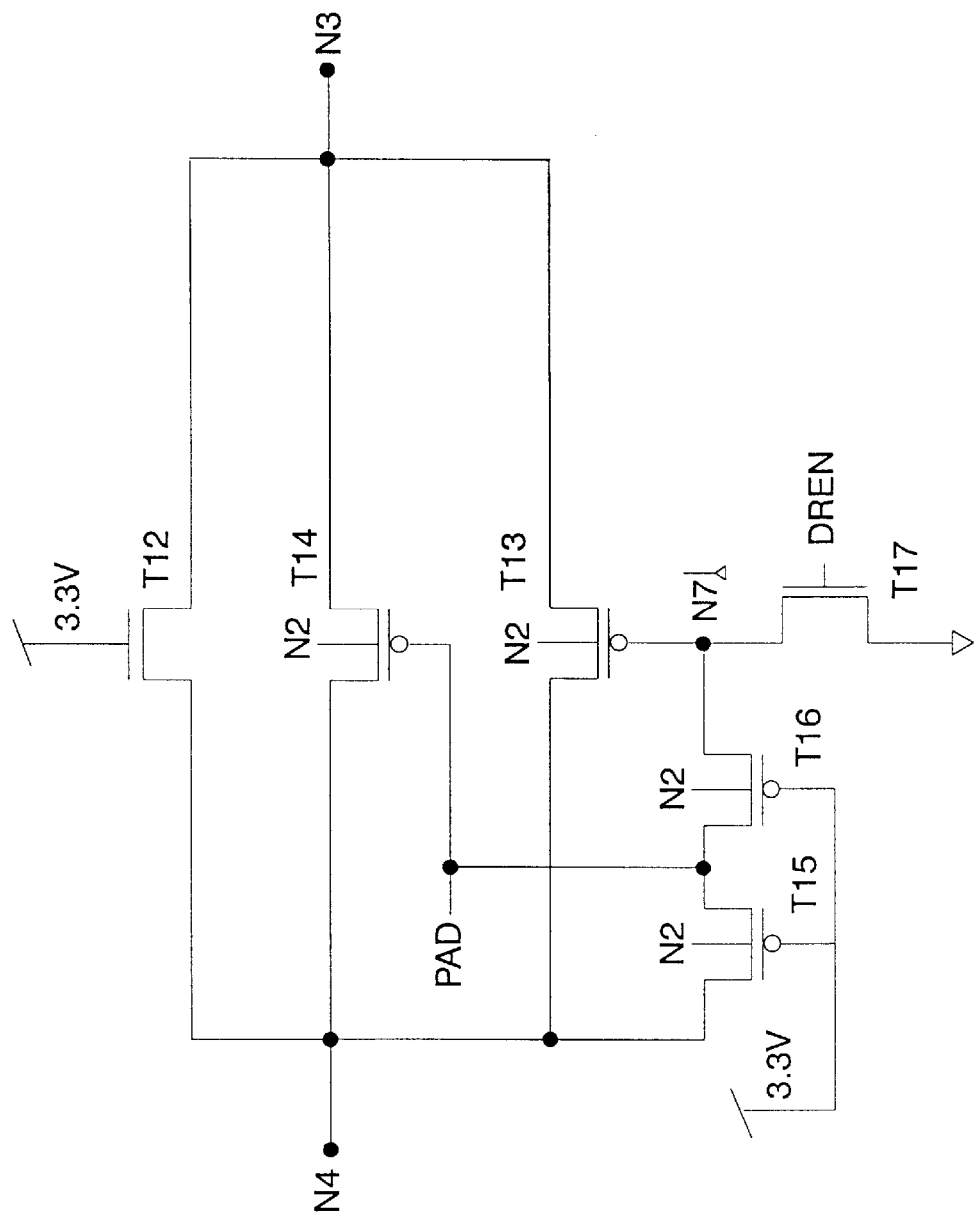
FIG. 4 illustrates in detail a section of the protection circuit of FIG. 3.

Circuit C1, which is shown in detail in FIG. 4, provides two functions. The first is to keep PFET T9 off during an over-voltage condition at PAD, and the second is to isolate node N4 from node N3 during this condition. For PAD voltages up to 3.3 Volts, C1 acts as a transmission gate to pass the voltage from node N3 to node N4. Under this normal operation in driver mode, the signal DREN (Driver Enable) is a logic one, turning on NFET T17. This pulls down node N7, which turns on PFET pass gate T13. NFET pass gate T12 has its gate tied to 3.3 Volts, thus turning it on. PFETs T15 and T16 are off, and transistor T14 helps increase the performance of the transmission gate when the logic value of node N3 changes from a one to a zero.

The over-voltage condition occurs in the receive mode where node N3 is held at 3.3 Volts and this voltage is passed to node N4. When PAD rises above 3.3 Volts to its maximum voltage of 7.3 Volts, PFET T9 (shown in FIG. 3) would start to conduct current from PAD to the 3.3 Volt supply. Circuit C1 allows node N4 to rise above 3.3 Volts and track the PAD voltage, keeping PFET T9 off. In receive mode, the signal DREN is a logic zero that turns off NFET T17.

When PAD voltage rises above 3.3 Volts, NFET pass gate T12 is on, PFET pass gate T14 is off, and PFET pass gates T15 and T16 turn on, charging nodes N4 and N7 to the PAD voltage. This shuts off PFET pass gate T13 and allows PFET pass gate T15 to node N4 at the PAD voltage. This keeps PFET T9 (shown in FIG. 3) off for the over-voltage condition. Because transistors T13 and T14 are off, the only path from node N4 to node N3 is through NFET pass gate T12. Pass gate T12 will limit the voltage at node N3 to a Vt below 3.3 Volts, thus protecting the devices in buffer B3 of FIG. 3.

All the transistors in C1 are thick-oxide devices that tolerate the MIV and isolate the devices tied to node N3 from the MIV.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A driver circuit for driving a bidirectional pad, comprising:

a diode connected from ground to said pad;

one or more series connected diodes connected from said pad to a first voltage supply;

a thick oxide PFET having a source connected to said first voltage supply, a drain connected to said pad, and an N-WELL;

a first thick oxide NFET having a drain connected to said pad, a gate connected to said first voltage supply, and a source;

a second thick oxide NFET having a drain connected to said source of said first NFET and a source connected to said ground;

a bias circuit for biasing said N-WELL of said PFET to the higher of either the voltage at said pad or said first voltage supply, and an isolation circuit for turning off said PFET when said voltage at said pad rises above said first voltage supply.

2. A driver circuit according to claim 1, wherein:

the N-WELL includes (i) a series of thick oxide transistors connected together to form an N-WELL bias circuit, and (ii) an N-WELL node; and the N-WELL bias circuit holds the N-WELL node at the first voltage when the pad voltage is less than or equal to said first voltage, and allows the N-WELL node to track the pad voltage when the pad voltage rises above said first voltage.

\* \* \* \* \*